United States Patent
Burroughs et al.

(10) Patent No.: US 11,836,676 B2
(45) Date of Patent: Dec. 5, 2023

(54) DETERMINING VENDOR COMPONENTS, KITS, AND LOGISTICS BASED ON CONSTRUCTION DRAWINGS

(71) Applicant: Applied Software Technology, Inc., Atlanta, GA (US)

(72) Inventors: Richard Burroughs, Atlanta, GA (US); Clay Smith, Phoenix, AZ (US); Rick Buckman, Phoenix, AZ (US); Fausto Mendez, Phoenix, AZ (US)

(73) Assignee: EVOLVE MEP, LLC, Atlanta, GA (US)

( * ) Notice: Subject to any disclaimer, the term of this patent is extended or adjusted under 35 U.S.C. 154(b) by 31 days.

(21) Appl. No.: 16/055,066

(22) Filed: Aug. 4, 2018

(65) Prior Publication Data
US 2019/0043014 A1 Feb. 7, 2019

Related U.S. Application Data

(60) Provisional application No. 62/541,469, filed on Aug. 4, 2017.

(51) Int. Cl.
| | |
|---|---|
| G06Q 10/08 | (2023.01) |
| G06Q 30/06 | (2023.01) |
| G06F 30/13 | (2020.01) |
| G06Q 10/0875 | (2023.01) |
| G06Q 30/0601 | (2023.01) |
| H04L 67/06 | (2022.01) |

(52) U.S. Cl.
CPC ........ *G06Q 10/0875* (2013.01); *G06F 30/13* (2020.01); *G06Q 30/0633* (2013.01); *G06Q 30/0643* (2013.01); *H04L 67/06* (2013.01)

(58) Field of Classification Search
CPC .......... G06Q 10/0875; G06Q 30/0643; G06Q 30/0633; G06F 30/13; H04L 67/06
USPC .......................................... 705/7.37; 703/22
See application file for complete search history.

(56) References Cited

U.S. PATENT DOCUMENTS

| | | | | |
|---|---|---|---|---|
| 2003/0229482 A1* | 12/2003 | Cook | ...................... | G06F 30/30 703/14 |
| 2004/0133415 A1* | 7/2004 | Rappaport | ............ | H04L 41/145 703/22 |
| 2010/0324956 A1* | 12/2010 | Lopez | .............. | G06Q 10/06375 705/315 |
| 2018/0322225 A1* | 11/2018 | Schwartz | ................ | G06T 19/00 |

\* cited by examiner

*Primary Examiner* — Peter Ludwig
*Assistant Examiner* — Reva R Moore
(74) *Attorney, Agent, or Firm* — Clayton, McKay & Bailey, PC (57) ABSTRACT

Systems and methods presented herein provide a server that receives a drawing. The server matches assembly types to elements in the drawing and inserts a symbol overlay into the drawing. The symbol overlay includes metadata identifying the assembly types in the drawing. The assembly types are matched to assemblies, including kits, based on user-identified criteria, such as vendor and building codes. The system can then determine logistics for delivering the kits, automatically staggering shipment where dictated by build order of the kits.

20 Claims, 7 Drawing Sheets

DETERMINING VENDOR COMPONENTS, KITS, AND LOGISTICS BASED ON CONSTRUCTION DRAWINGS

CROSS-REFERENCE TO RELATED APPLICATIONS

This non-provisional application claims priority to provisional application No. 62/541,469, titled "Determining Vendor Components, Kits, and Logistics Based on Construction Drawings," filed Aug. 4, 2017. Application No. 62/541,469 is also incorporated by reference in its entirety.

BACKGROUND

Computer-aided design ("CAD") software allows users to design structures for construction, among other things. One type of CAD software is Building Information Modeling ("BIM") software, which allows users to elaborately design three-dimensional structures. AUTODESK REVIT is one type of BIM software that can be used to design complex buildings all the way down to components and assemblies for use in a project. For example, a user can model an entire plumbing or electrical installation within a building.

BIM software often includes templates for conduit and other construction assemblies, allowing the designer to lay out conduit in the plan. REVIT templates for conduit and other components, such as plumbing or air conditioning ducts, can allow a user to draw a long run and easily visualize where the components will go.

However, the template conduit is for visualization purposes only, and is of limited use for fabrication. Different vendors can sell parts kits that may require assembly into one or more part assemblies shown in a drawing, such as a 2D or 3D CAD or BIM drawing. The parts, assembly, and pricing can vary depending on which vendor supplies which parts or assemblies included in the drawings. Additionally, the drawings do not necessarily include the detail required for assembly. As an example, a long conduit run of 50 feet would appear to be one long piece of conduit based on the generic REVIT template. But in the real world, this same run would be broken into multiple connected pieces of conduit for cost savings and transportation feasibility.

Because of this limitation on current CAD and BIM technology, much time is spent attempting to determine what parts are actually needed and what the cost will be, based on a CAD or BIM drawing. Each vendor typically must determine which assemblies can apply. It is often left to the builder or construction professional to stage ordering appropriately.

Therefore, a need exists for a system that can provide vendor-specific kits, staging, and ordering logistics based on a CAD or BIM drawing.

SUMMARY

The examples described herein specifically address technical problems and limitations of REVIT and similar BIM software. The examples include a server that can receive a drawing. A user can upload the drawing at an estimator graphical user interface ("GUI"), in an example. The GUI can be generated by the server in one example. A specification filter ("spec filter") can analyze the drawing to determine common structures, such as electrical outlets or other assemblies. The spec filter can insert symbols into the drawing. In one example, the spec filter can do this automatically by recognizing nomenclature in the drawing. In another example, the user can identify a symbol in the drawing as a particular assembly, and the spec filter can identify like symbols as the same assembly type.

The symbols can represent assemblies associated with a vendor in an example. The spec filter can access data from a vendor database that identifies the relevant assemblies in one example. The spec filter can add a symbol layer to the drawing that contains metadata identifying each symbol. The metadata can allow the system to identify the correct vendor assemblies. In one example, the system adds the symbol layer by accessing BIM software, such as REVIT, via a plugin. The metadata can include information about the assemblies or kitting.

The GUI can display the drawing with a symbol overlay. The symbol overlay can visually indicate which elements are associated with which symbols (e.g., component types). The user can continue to change or assign symbols if any are not already fully allocated correctly by the spec filter. In one example, the symbol overlay is generated by a plugin that interfaces with a CAD program. Alternatively, it can be part of the spec filter or a stand-alone web application.

Next, the system can determine the kits that will be needed based on the metadata or symbols in the symbol layer. The server can then select the appropriate assembly kits based on information provided by the user to narrow the applicable kits. For example, the user can set up a profile for their project before or after scanning the drawing. The profile can indicate one or more applicable vendors. It can also indicate a building code jurisdiction, which can be associated with particular building codes that dictate part sizes, materials, and other relevant assembly attributes. Based on the profile information, the server can determine which kits apply to the various symbols in the drawing. This can be done by querying one or more vendor databases to determine the applicable kits based on the symbol layer metadata.

The GUI can present a bill of materials or purchase order that includes the staging information, in one example. The user can then select to purchase the kits, and the purchase order can be sent to the vendor for shipment.

The system can then perform logistics related to the kit delivery. For example, based on certain types of assemblies requiring installation before others, the system can stage delivery over a period of time. The packages can also include custom tags and site-specific staging information based on the user-identified information. Appropriate orders can be generated by the system and sent automatically to each applicable vendor.

While a server example is explained, a web server is not required in all examples. Instead, the system can operate based on an application executing on a computing device operated by the user, in an example.

It is to be understood that both the foregoing general description and the following detailed description are exemplary and explanatory only and are not restrictive of the embodiments, as claimed.

BRIEF DESCRIPTION OF THE DRAWINGS

The accompanying drawings, which are incorporated in and constitute a part of this disclosure, illustrate various embodiments and aspects of the present invention. In the drawings.

DESCRIPTION OF THE EXAMPLES

Reference will now be made in detail to the present exemplary examples, including examples illustrated in the accompanying drawings. Wherever possible, the same reference numbers will be used throughout the drawings to refer to the same or like parts. The described examples are non-limiting.

In one example, a user logs into the system, such as at a web server. If no project exists, the user can create a new project. The user can enter information about the project, such as name, address, phone number, and other information. Then the user can select product list filters that specify user-identified criteria. Alternatively, an existing project can already have the user-identified criteria selected. This can be done based on a user profile stored or sent to the server, in an example.

The user can pick an existing drawing file, such as a PDF, DWG, TIFF, or upload a new one. Then the user can use a viewer to identify elements in the drawing within a graphic overlay. For example, the user can select a visual element and then indicate a component type (e.g., assembly type). These can also be referred to as "smart points." These identified elements can then be further recognized by a spec filter, that can then assign the same component type to like elements. The spec filter can add symbols and/or metadata to the graphic overlay automatically based on the initial user selections.

The system can then determine applicable components, assemblies, and kits based on the user-identified criteria. The system can present a bill of materials to the user for approval.

When the user places an order, the system can aggregate components, assemblies, and kits per vendor, and send orders to each vendor. A logistic component at the server can make sure the orders are staged correctly. For example, light fixtures can be ordered from a first vendor (i.e., supplier) and other components can be ordered from a second vendor. The orders can be staged based on user-identified criteria indicating projected build schedules.

The shipments can also be specially labelled based on the user-identified criteria. For example, bar codes, text, or RFID labels can be specified in advance by the user or be part of the stored user profile. Additionally, at the job site, the packaging can contain routing information for staging areas for the different kits.

Figure 1:
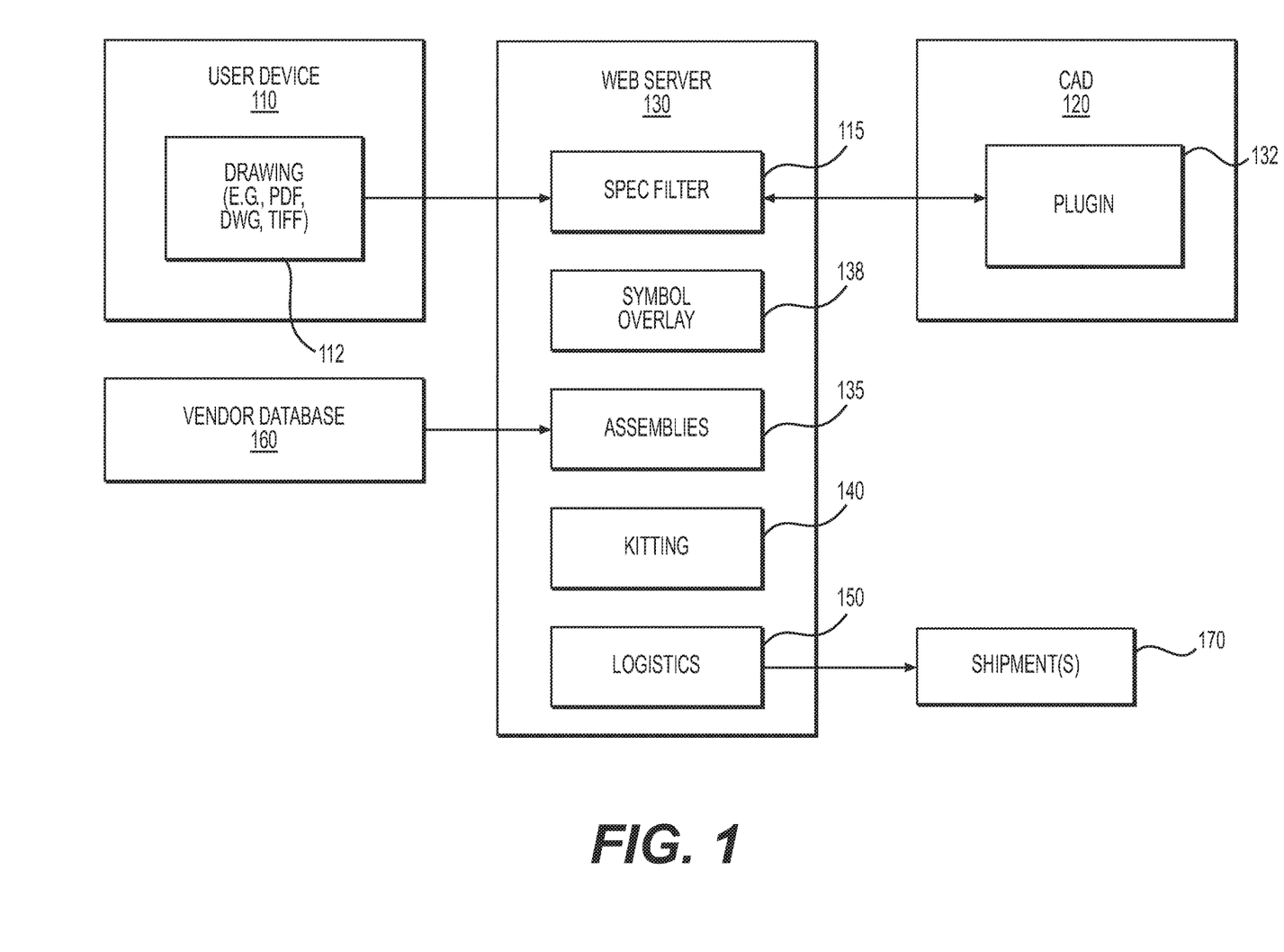
FIG. 1 is an exemplary illustration of system components.

FIG. 1 includes an exemplary diagram of a system 100 in accordance with an example. A user device 110 can be used to supply a drawing 112 to a spec filter 115. The drawing 112 can be any file type that includes a graphical representation of a construction or building plan. Example file types include PDF, DWG, and TIFF files. In one example, a file containing vectors representing building structure is used. The drawing can be two-dimensional or three-dimensional in nature.

The spec filter 115 can be an application that executes on a computing device, such as user device 110 or server 130. The server 130 can be a web server that the user device 110 access over the internet. The server 130 can include one or more processors and one or more servers. It can be hosted on the cloud, in an embodiment.

The spec filter 115 can include a GUI that allows the user to upload or open the drawing 112 from user device 110. In one example, the GUI allows the user to link a first element in the drawing 112 to an assembly type. For example, a first element in the drawing could indicate an electrical outlet. A second element can indicate conduit. A third element can indicate a ceiling fan. The user can identify these assembly types, in one example, by clicking on or otherwise capturing or indicating an element, and then selecting an element type from a drop-down list or other selection component. Then, the spec filter can recognize similar elements and automatically assign the corresponding assembly types to those elements. In still another example, the spec filter 115 is able to recognize standard symbols in the drawing 112.

The spec filter 115 can also add symbols to an overlay 138 to the drawing 112. The symbol overlay 138 can indicate which symbols (component types) correspond to which elements in the drawing 112. A panel of symbols can allow the user to easily select different symbol types and apply them to the drawing. For example, the user can select a first symbol, and then apply it to the drawing by clicking a various locations on the symbol overlay (over the drawing).

The symbol overlay 138 can also include metadata that describes the component types or allows the system to identify the particular components, kits, and assemblies. The metadata can indicate the location of a particular assembly type. This metadata can be accessed by the server 130 or in a CAD 120 program, such as REVIT, to determine assemblies 135 that correspond to the symbols.

In one example, the system can select assemblies 135 that correspond to the assembly types and meet user-identified criteria. For example, the user-identified criteria and metadata indicating an assembly type can be compared to components, assemblies, and kits in a vendor database 160. The vendor database 160 can be remove from the server 130 or can be part of or local to the server 130. The vendor database 160 can be accessed by a plugin 132 executing in REVIT in one example.

An example metadata can be formatted as follows:
Name: Lighting Panelboard—208V MLO
Type: [Panelboard]
Voltage: 208
Dimensions: Width 1'8"; Depth 0'5¾"
Mains: 100.00 A The user-identified criteria can influence things like wire gauge. It can also influence or specify which kitting 140 applies to which assembly 135. More or less kitting 140 might be desired, depending on the user.

In one example, the server 130 sends the drawing with symbol overlay to REVIT or another CAD 120 program. Using a plugin 132 that includes application programming interface (API) commands, the server 130 can send the drawings 112 to CAD 120 and cause the CAD 120 program to model the floorplan with vendor assemblies 135. This can allow the user to visualize the floorplan with assemblies 135 in place that meet the user-identified criteria.

The CAD 120 program can also output a list of materials and assemblies back to the server 130 for transformation into a bill of materials. The bill of materials can include kits and assemblies from multiple vendors. The server can group the components by vendor to send individual purchase orders to each vendor, once the user approves.

The bill of materials can include labor rates, which can be part of the metadata associated with the symbols. Kits can also be represented in the bill of materials based on the metadata.

In one example, the server 130 has a web interface with vendors for placing orders with the vendors (i.e., suppliers). The orders can include part numbers, pricing, and kitting, based on the metadata being linked to the vendor parts based on the user-identified criteria. Shipping and delivery information can be embedded into the order, allowing each vendor to simply fill the order without additional complication.

The assemblies 135 can be built using one or more kits 140, in an example. The vendor database 160 can indicate which kits 140 correspond to which assemblies 135. The kits can include packages of parts for on-site assembly in one example. The assembly order can further be specified by the vendor database 160.

A logistics component 150 can execute at the server 130 or on a remote vendor server for scheduling shipments 170. The logistics component 150 can also group components by vendor so that multiple purchase orders are generated based on the number of vendors.

The logistics component 150 can stagger shipping in one example, based on kit 140 assembly time. In another example, assembly types themselves are staggered. For example, an electrical junction box would be installed in a project before a ceiling fan. Therefore, the logistics component 150 can schedule shipment of the electrical junction box two months ahead of the ceiling fan.

The server 130 can also provide a GUI for entering user-identified criteria. This can include one or more selected vendors, building codes, or material types. In this way, the user can narrow the field of possible assemblies, kits, and components that will be used in the project.

The user device 110 can be any processor-based device, such as a personal computer, laptop, tablet, or cell phone. It can also include or be part of a server in one example. The user device 110 can execute REVIT or another CAD 120 application, in one example, by executing a set of instructions stored locally or remotely on a computer-readable medium. In another example, the spec filter 115 can execute locally on the user device 110.

In one example, a vendor database 120 stores the custom components. The custom components can include parameters used to ensure the sizing is accurate and that the components are directly usable for fabrication. Alternatively, the vendor database 120 can simply identify the components (e.g., assemblies) in a way that the vendor recognizes. The database 120 can be implemented by any type of computing device. In one example, the database 120 is part of user device 110. In another example, the database 120 is remotely accessible by the user device 110, such as over a network. The network can be a local area network, an enterprise network, or the Internet. In one example, multiple computing devices 105 in an enterprise can remotely access the database 120 over a network.

Using the API, REVIT 110 can execute custom methods for the plugin 132 when certain events occur within REVIT 110. Events are generated when an action is submitted to a REVIT 110 server for performance by REVIT 110. The plugin 132 can implement the events to cause REVIT 110 to communicate with the plugin 132. The plugin 132 then can execute custom methods for customized functionality.

Figure 2:
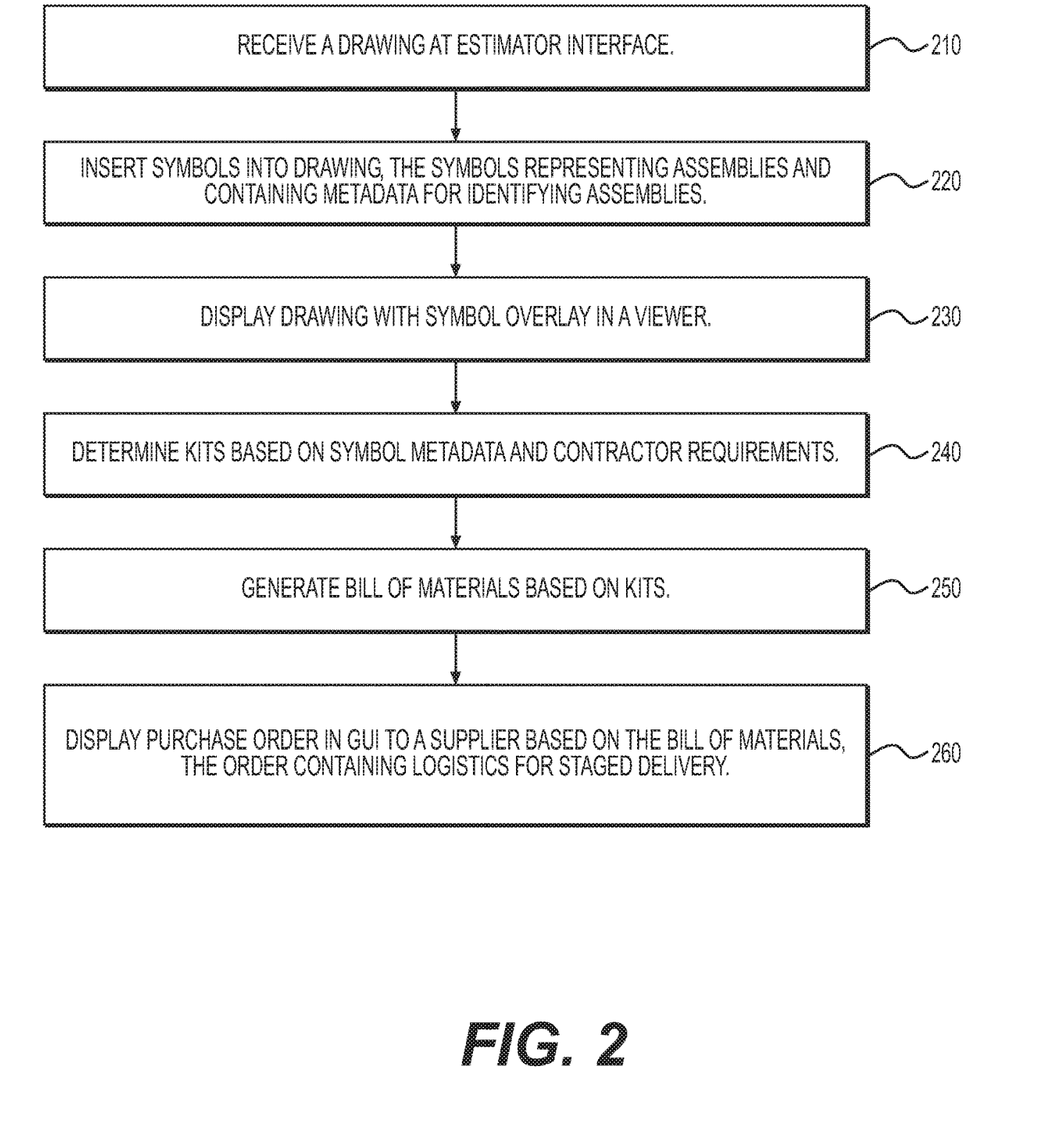
FIG. 2 is an exemplary flow chart.

FIG. 2 is an example flow chart, in an example. At stage 210, the system can receive a drawing 112 at an estimator interface. The estimator interface can be part of server 130 and include a GUI. The GUI can be a web interface in an example. The user can browse to a drawing 112 file on their own user device 110. The drawing 112 can them be opened in the estimator interface.

A spec filter can execute, providing a view of the drawing 112. The spec filter can receive inputs from the GUI that allow the user to identify one or more elements in the drawing as correlating to component types (e.g., assembly types). Then, the spec filter can attempt to locate other like elements through visual recognition technology. The spec filter can assign the same component types to the matching elements.

At stage 220, based on these component types, the system can insert symbols into the drawing 112. This can include inserting symbols in a symbol overlay, which can act as a foreground layer over the original drawing 112 in an example. The symbols can represent prefabricated parts, based on the user-identified criteria.

In one example, the estimator interface can access a CAD 120 program, such as REVIT, to display the drawing 112 with the symbol overlay at stage 230. The symbol overlay 138 can include metadata identifying particular assemblies 135 or assembly types. In one example, the plugin 132 causes REVIT to display vendor assemblies 135 meeting user-identified criteria in the symbol overlay. This can allow the user to better visualize a floorplan with accurate assemblies rather than whatever elements existed previously in the drawing 112.

At stage 240, the system can create a purchase order. This can include determining kits 140 required for the identified assemblies 135. Kits 140 can be packages of parts that are put together to build a particular assembly 135.

At stage 250, the system can then generate a bill of materials. In one example, the user is able to confirm different components listed in the bill of materials. Once the user is ready, they can select a button in the GUI to generate a purchase order. Alternatively, the bill of materials can be send to the vendor, who sends the user a link to a purchase order. The purchase order can include staging information that dictates shipping, in an example.

Figure 3A:
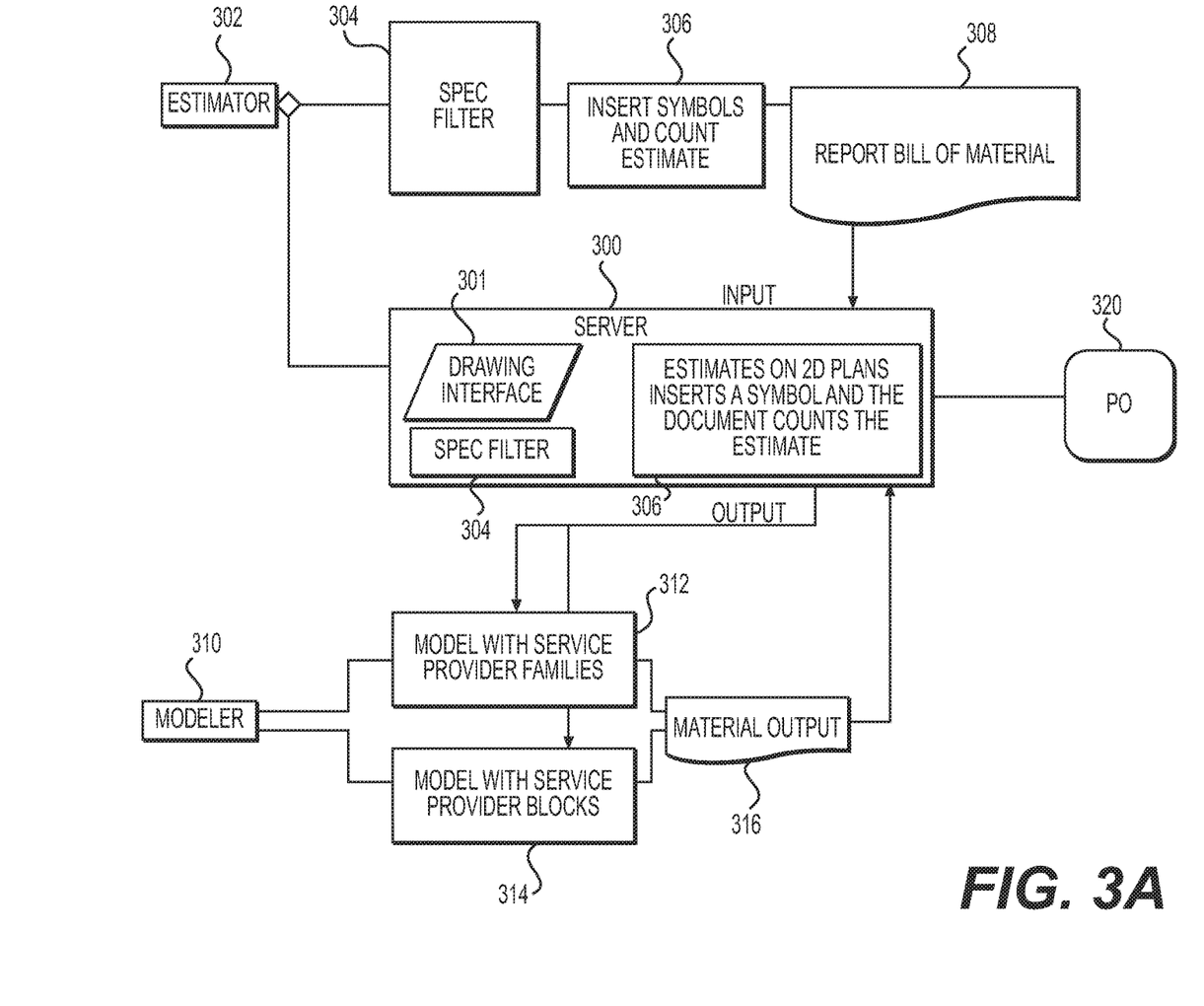
FIG. 3A is an example flow chart.

FIGS. 3A, 3B, 3C, and 3D provide further example flow chart and system component detail. The term "service providers" in these FIGs. can refer to vendors in one example. Turning to FIG. 3A, at stage 302 the system can provide an estimator application for use by the user. This can be running at a server 300 or locally on the user device. The application can include a drawing interface 301, where the user's drawing is displayed. The drawing can be selected by the user.

Then, at stage 304, the spec filter can analyze the drawing to determine common structures, such as electrical outlets or other assemblies. The spec filter can insert symbols into the drawing. The spec filter can execute on the user device or on the server 300.

The application can allow the user to insert symbols at stage 306. The application can also count the symbols as part of providing an estimate. Because the symbols can represent various parts or assemblies, the counts can be multiplied by costs for the corresponding parts and assemblies. Additionally, kitting and timing for the parts and assemblies can be considered. In one example, the application generates a bill of material at stage 308. This can be stored on the server 300 and used to generate a purchase order at stage 320.

In one example, at stage 310 the application can provide modeler capabilities. This can include an interface where the user specifies which service provider to use. For example, the user can apply a particular manufacturer's parts to the drawing.

In one example, the server 300 can output the estimate information from stage 306 to the modeler. For example, at stage 312 or 314, the modeler can apply service provider families or blocks to the information represented by the symbols. In CAD, a block is a collection of objects that are combined into a single named object. Families can be particular collections of a service provider, such as a particular collection of assemblies. By applying the symbols to particular families and blocks at stages 312 and 314, specific material lists can be generated at stage 316. This can include a staged material list with multiple shipping dates, based on staged construction of the families and blocks.

Figure 3B:
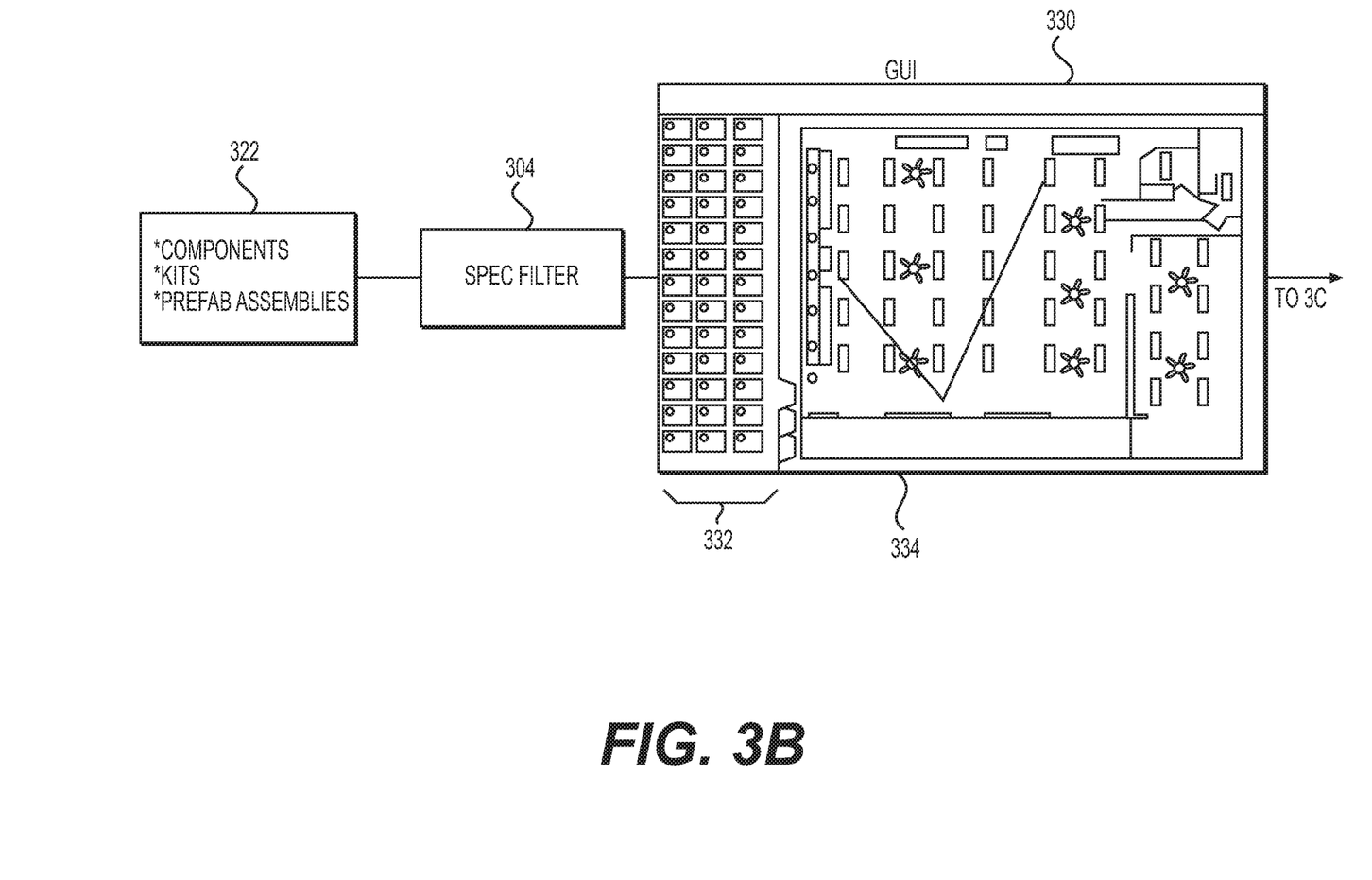
FIG. 3B illustrates exemplary system components.

FIG. 3B includes a more detailed illustration of system components used in placing symbols in a drawing. In one example, the components, such as kits and assemblies selected with the modeler, are used by the spec filter at stage 304 to add symbols 322 to the drawing 334 in the GUI 330. The symbols 322 can include a variety of different colored, shaped, or patterned symbols that get applied to the drawing 334 where the spec filter recognizes a matching component. The user can also select a symbol 332 and click the drawing 334 at locations where symbols should be placed in the symbol layer above the drawing.

The annotated drawing or estimate information based on the symbols can then be used by the system to provide cost estimates and material lists. For example, in FIG. 3C, the system can use this output to report a bill of material at stage 340. The GUI 330 can provide a screen for the user to review the bill of material at stage 342. As shown in pane 354 of GUI 344 in FIG. 3C, this can include listing the various items and kits determined by matching the symbol types to the blocks and families pre-selected by the user. The user can select particular items by using GUI elements 352, and can then edit or approve those elements, in an example.

Figure 3C:
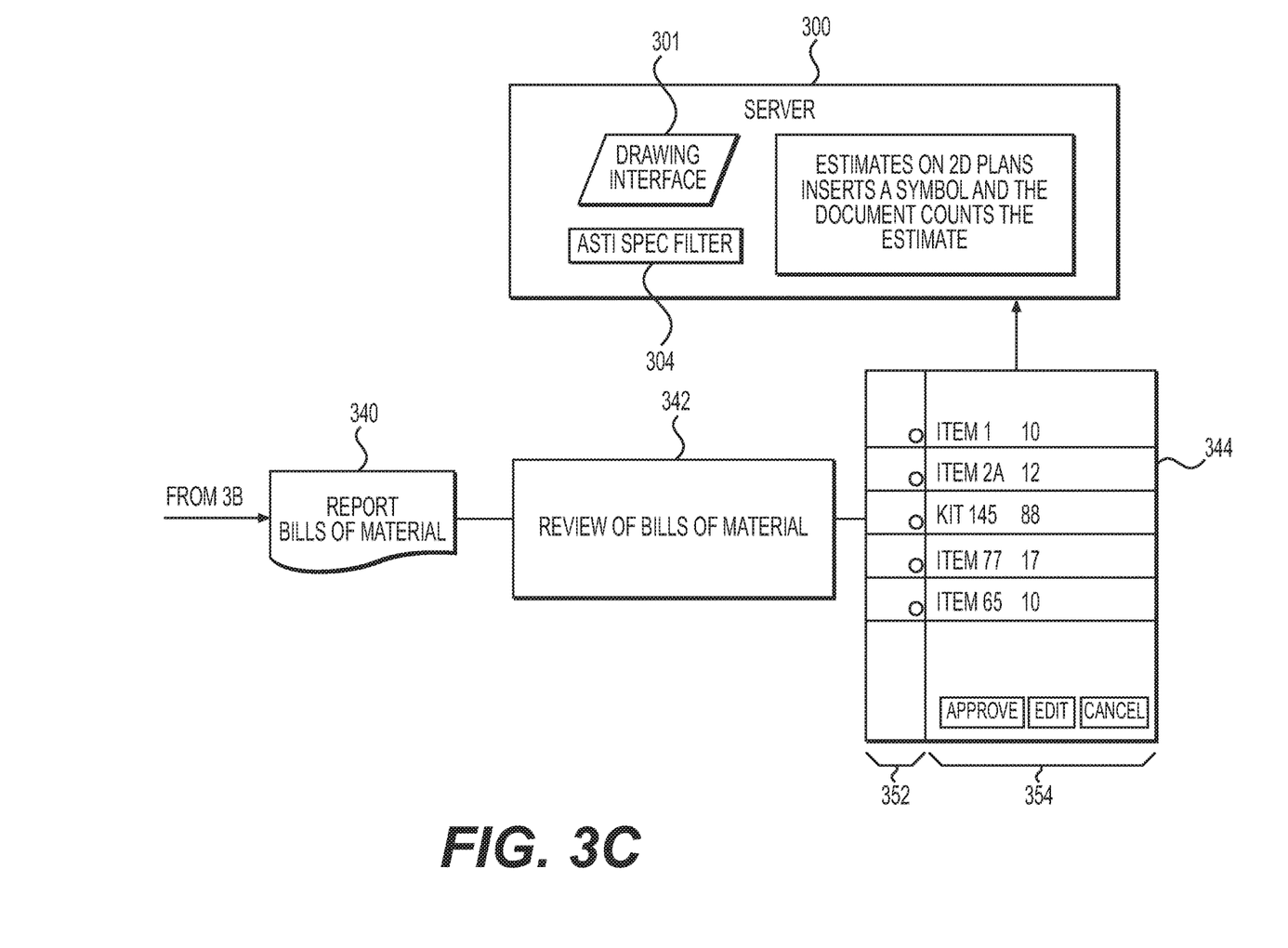
FIG. 3C is an example flow chart.

This reviewed bill of material can then be sent by the application to the server, where it can be stored. The server can also schedule shipments of the kits and parts. The scheduled shipments can be based on project information. For example, kits and parts can be associated with one or more phases of a project, such as "electrical." The project can include a schedule for the phases, allowing the system to stagger shipping accordingly.

Figure 3D:
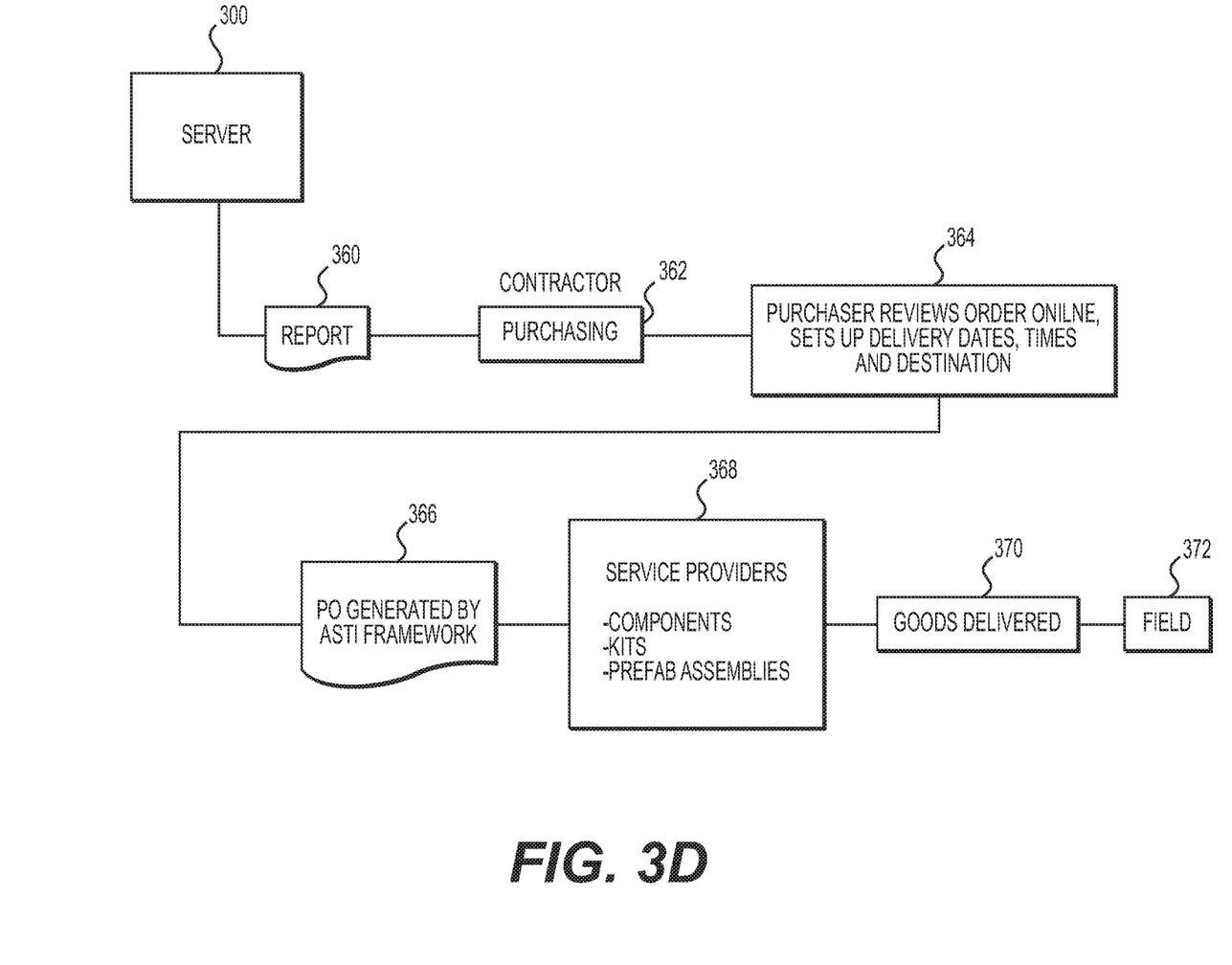
FIG. 3D is an example flow chart.

FIG. 3D includes an exemplary flowchart related to purchasing and shipping. At stage 360, the server 300 can send the user's report (e.g., bill of material) to a contractor. The contractor can then supply purchasing information to the user at stage 362, such as by emailing the user an invoice or a link to an order portal that contains the order. At stage 364, the user can review the order online. This can allow the user to change or enter delivery dates, times, and destinations. Initial values can be selected by the system based on the aforementioned project information. The project information can include a construction schedule and location.

After the user has reviewed and edited the delivery dates and locations, at stage 366 the system can generate a purchase order. The purchase order can include a parts list, pricing, and delivery information.

At stage 368, the service providers can be contacted and can fill the purchase order. This can include organizing the various components, kits, and prefab assemblies into staged delivery. At stage 370, these goods can be delivered. At stage 372, they can be installed in the field.

Figure 4:
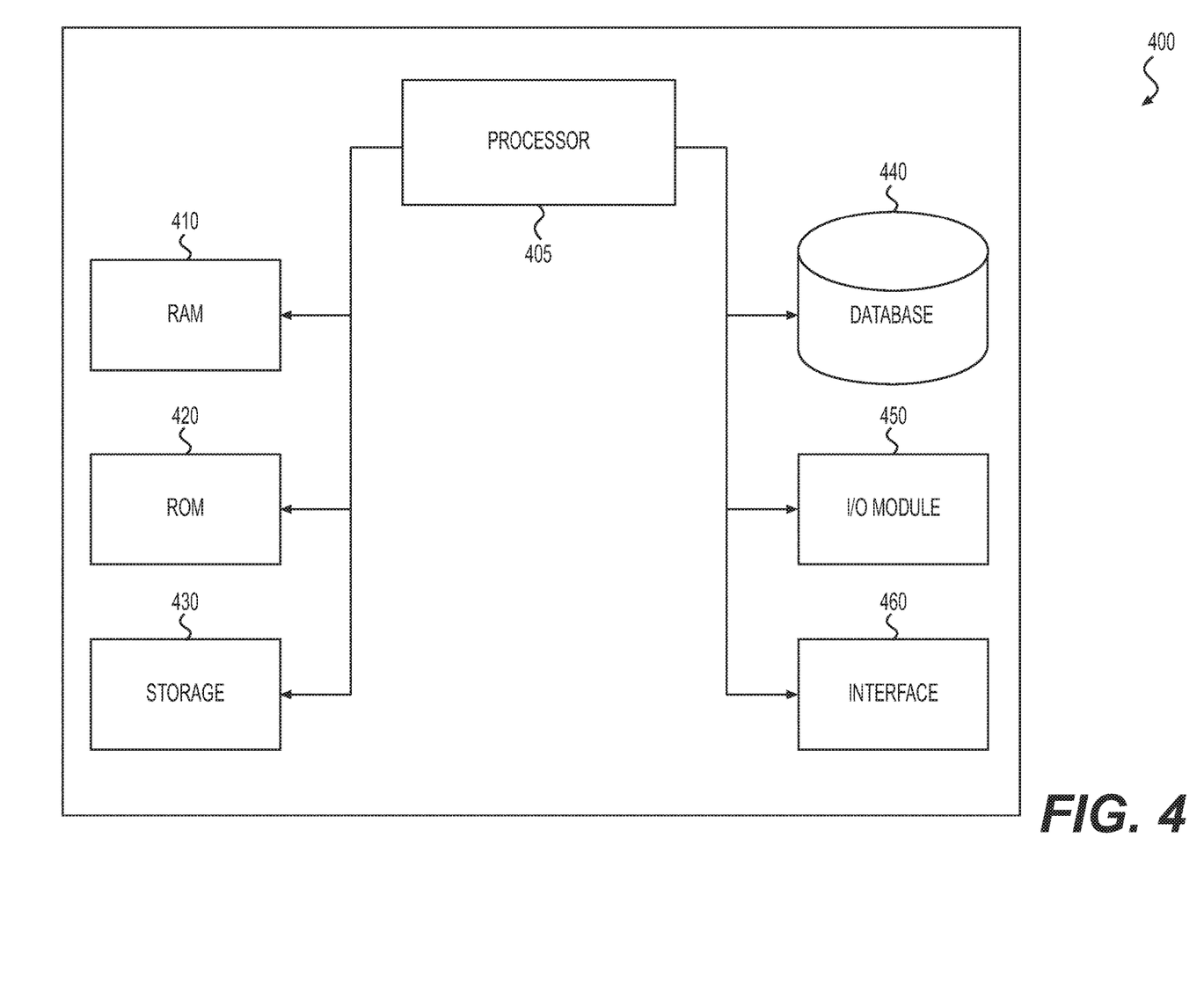
FIG. 4 illustrates exemplary system components.

FIG. 4 depicts an exemplary processor-based computing system 400 representative of the type of user device 110 of FIG. 1. Continuing with FIG. 4, the computing system 400 is exemplary only and does not exclude the possibility of another processor- or controller-based system being used in or with one of the aforementioned components. Additionally, a server or other user device 110 need not include all the system hardware components in an embodiment.

In one aspect, system 400 may include one or more hardware and/or software components configured to execute software programs, such as software for storing, processing, and analyzing data. For example, system 400 may include one or more hardware components such as, for example, processor 405, a random access memory (RAM) module 310, a read-only memory (ROM) module 420, a storage system 430, a database 440, one or more input/output (I/O) modules 450, and an interface module 460. Alternatively and/or additionally, system 400 may include one or more software components such as, for example, a computer-readable medium including computer-executable instructions for performing methods consistent with certain disclosed embodiments. It is contemplated that one or more of the hardware components listed above may be implemented using software. For example, storage 430 may include a software partition associated with one or more other hardware components of system 400. System 400 may include additional, fewer, and/or different components than those listed above. It is understood that the components listed above are exemplary only and not intended to be limiting.

Processor 405 may include one or more processors, each configured to execute instructions and process data to perform one or more functions associated with system 400. The term "processor," as generally used herein, refers to any logic processing unit, such as one or more central processing units (CPUs), digital signal processors (DSPs), application specific integrated circuits (ASICs), field programmable gate arrays (FPGAs), and similar devices. As illustrated in FIG. 4, processor 405 may be communicatively coupled to RAM 410, ROM 420, storage 430, database 440, I/O module 450, and interface module 460. Processor 405 may be configured to execute sequences of computer program instructions to perform various processes, which will be described in detail below. The computer program instructions may be loaded into RAM for execution by processor 405.

RAM 410 and ROM 420 may each include one or more devices for storing information associated with an operation of system 400 and/or processor 405. For example, ROM 420 may include a memory device configured to access and store information associated with system 400, including information for identifying, initializing, and monitoring the operation of one or more components and subsystems of system 400. RAM 410 may include a memory device for storing data associated with one or more operations of processor 405. For example, ROM 420 may load instructions into RAM 410 for execution by processor 405.

Storage 430 may include any type of storage device configured to store information that processor 405 may need to perform processes consistent with the disclosed embodiments.

Database 440 may include one or more software and/or hardware components that cooperate to store, organize, sort, filter, and/or arrange data used by system 400 and/or processor 405. For example, database 440 may include user-specific information, including password information, along with the custom objects and customization data. Alternatively, database 440 may store additional and/or different information. Database 440 may also contain a plurality of databases that are communicatively coupled to one another and/or processor 405, which may be one of a plurality of processors utilized by server 430.

I/O module 450 may include one or more components configured to communicate information with a user associated with system 400. For example, I/O module 450 may include a console with an integrated keyboard and mouse to allow a user to input parameters associated with system 400. I/O module 450 may also include a display including a graphical user interface (GUI) for outputting information on a monitor. I/O module 450 may also include peripheral devices such as, for example, a printer for printing information associated with system 400, a user-accessible disk drive (e.g., a USB port, a floppy, CD-ROM, or DVD-ROM drive, etc.) to allow a user to input data stored on a portable media device, a microphone, a speaker system, or any other suitable type of interface device.

Interface 460 may include one or more components configured to transmit and receive data via a communication network, such as the Internet, a local area network, a workstation peer-to-peer network, a direct link network, a wireless network, or any other suitable communication platform. For example, interface 460 may include one or more modulators, demodulators, multiplexers, demultiplexers, network communication devices, wireless devices, antennas, modems, and any other type of device configured to enable data communication via a communication network.

Other embodiments of the invention will be apparent to those skilled in the art from consideration of the specification and practice of the invention disclosed herein. It is understood that the examples can operate as an application or plugin with REVIT or any other BIM or CAD program. Also, the terms part, component, and assembly are used interchangeably. It is intended that the specification and examples be considered as exemplary only, with a true scope and spirit of the invention being indicated by the following claims.

What is claimed is:

1. A system for creating kit assembly orders from a drawing, including:
   a database that stores kit information;
   a processor that executes instructions to perform stages comprising:
   receiving, at an estimator graphical user interface ("GUI"), upload of a construction drawing, wherein the GUI is generated by a plugin that uses application programming interface ("API") commands to create the GUI within a computer-aided design application, wherein the GUI is already generated when it receives the upload of the construction drawing;
   identifying, by the plugin, graphical elements of a recurring assembly type within the uploaded drawing, wherein the assembly type is one of an electrical assembly, plumbing assembly, or ductwork assembly;
   automatically inserting symbols into the drawing based on the plugin detecting the location of the recurring assembly type, the symbols including symbol metadata in a symbol overlay;
   displaying, in the GUI, the drawing with the inserted symbols of the symbol overlay;
   determining, from a set of possible assemblies, first assemblies that correspond to the symbols, the determination based on at least (1) user-identified criteria selected on the GUI and (2) the symbol metadata;
   generating, from the uploaded drawing, a printable bill of materials on the GUI, wherein the bill of materials includes the first assemblies corresponding to the inserted symbols; and
   staging a set of kits that make up the first assemblies for staggered delivery, including assigning different shipping times for first and second kits within the set of kits based on assembly time of the first kit based on criteria indicating that the first kit needs to be assembled before the second kit, wherein the first and second kits are routed to different staging areas that correspond to locations in the drawing, wherein packages for the first and second kits include site-specific staging information.

2. The system of claim 1, where inserting the symbols includes:
   receiving a user selection of a first element within the drawing;
   receiving the assembly type to associate with the first element;
   scanning the drawing to match other elements to the first element; and
   inserting the symbols at the other elements.

3. The system of claim 1, the stages further comprising:
   in response to approval of the bill of materials, sending a purchase order to a vendor of the first assemblies.

4. The system of claim 3, wherein the purchase order includes staging information for the set of kits that make up the first assemblies, the staging information causing the different shipping times for the first and second kits within the set of kits.

5. The system of claim 1, wherein determining the first assemblies includes selecting a kit based on the user-identified criteria, and wherein generated bill of materials includes the kit.

6. The system of claim 1, wherein the user-identified criteria includes material type, construction code information, and a vendor preference.

7. The system of claim 1, wherein the drawing is at least one of a PDF, DWG, or vector-based drawing, and the drawing is received through a graphical user interface (GUI) that allows a user to select the file for upload to a server.

8. A method comprising:
   receiving, at an estimator graphical user interface ("GUI"), upload of a construction drawing, wherein the GUI is generated by a plugin that uses application programming interface ("API") commands to create the GUI within a computer-aided design application, wherein the GUI is already generated when it receives the upload of the construction drawing;
   identifying, by the plugin, graphical elements of a recurring assembly type within the uploaded drawing, wherein the assembly type is one of an electrical assembly, plumbing assembly, or ductwork assembly;
   automatically inserting symbols into the drawing based on the plugin detecting the location of the recurring assembly type, the symbols including symbol metadata in a symbol overlay;
   displaying, in the GUI, the drawing with the inserted symbols of the symbol overlay;
   determining, from a set of possible assemblies, first assemblies that correspond to the symbols, the determination based on at least (1) user-identified criteria selected on the GUI and (2) the symbol metadata;
   generating, from the uploaded drawing, a printable bill of materials on the GUI, wherein the bill of materials includes the first assemblies corresponding to the inserted symbols; and
   staging a set of kits that make up the first assemblies for staggered delivery, including assigning different shipping times for first and second kits within the set of kits based on assembly time of the first based on records indicating that the first kit needs to be assembled before the second kit, wherein the first and second kits are routed to different staging areas that correspond to locations in the drawing, wherein packages for the first and second kits include site-specific staging information.

9. The method of claim 8, where inserting the symbols includes:
- receiving a user selection of a first element within the drawing;
- receiving the assembly type to associate with the first element;
- scanning the drawing to match other elements to the first element; and
- inserting the symbols at the other elements.

10. The method of claim 8, further comprising:
- in response to approval of the bill of materials, sending a purchase order to a vendor of the first assemblies.

11. The method of claim 10, wherein the purchase order includes staging information for the set of kits that make up the first assemblies, the staging information causing the different shipping times for the first and second kits within the set of kits.

12. The method of claim 8, wherein determining the first assemblies includes selecting a kit based on the user-identified criteria, and wherein generated bill of materials includes the kit.

13. The method of claim 8, wherein the user-identified criteria includes material type, construction code information, and a vendor preference.

14. The method of claim 8, wherein the drawing is at least one of a PDF, DWG, or vector-based drawing, and the drawing is received through a graphical user interface (GUI) that allows a user to select the file for upload to a server.

15. A non-transitory, computer-readable medium containing instructions for generating a bill of materials from a drawing, the instructions causing a processor to execute stages comprising:
- receiving, at an estimator graphical user interface ("GUI"), upload of a construction drawing, wherein the GUI is generated by a plugin that uses application programming interface ("API") commands to create the GUI within a computer-aided design application, wherein the GUI is already generated when it receives the upload of the construction drawing;
- identifying, by the plugin, graphical elements of a recurring assembly type within the uploaded drawing;
- automatically inserting symbols into the drawing based on the plugin detecting the location of the recurring assembly type, the symbols including symbol metadata in a symbol overlay, wherein the assembly type is one of an electrical assembly, plumbing assembly, or ductwork assembly;
- displaying, in the GUI, the drawing with the inserted symbols of the symbol overlay;
- determining, from a set of possible assemblies, first assemblies that correspond to the symbols, the determination based on at least (1) user-identified criteria selected on the GUI and (2) the symbol metadata;
- generating, from the uploaded drawing, a printable bill of materials on the GUI, wherein the bill of materials includes the first assemblies corresponding to the inserted symbols; and
- staging a set of kits that make up the first assemblies for staggered delivery, including assigning different shipping times for first and second kits within the set of kits based on assembly time of the first kit based on records indicating that the first kit needs to be assembled before the second kit, wherein the first and second kits are routed to different staging areas that correspond to locations in the drawing, wherein packages for the first and second kits include site-specific staging information.

16. The non-transitory, computer-readable medium of claim 15, where inserting the symbols includes:
- receiving a user selection of a first element within the drawing;
- receiving the assembly type to associate with the first element;
- scanning the drawing to match other elements to the first element; and
- inserting the symbols at the other elements.

17. The non-transitory, computer-readable medium of claim 15, the stages further comprising:
- in response to approval of the bill of materials, sending a purchase order to a vendor of the first assemblies.

18. The non-transitory, computer-readable medium of claim 17, wherein the purchase order includes staging information for the set of kits that make up the first assemblies, the staging information causing the different shipping times for the first and second kits within the set of kits.

19. The non-transitory, computer-readable medium of claim 15, wherein determining the first assemblies includes selecting a kit based on the user-identified criteria, and wherein generated bill of materials includes the kit.

20. The non-transitory, computer-readable medium of claim 15, wherein the user-identified criteria includes material type, construction code information, and a vendor preference.

* * * * *